United States Patent
Li et al.

(10) Patent No.: US 12,074,237 B2
(45) Date of Patent: Aug. 27, 2024

(54) PHOTOVOLTAIC LAMINATE COMPRISING SINGLE POLYMER COMPOSITE

(71) Applicant: SunPower Corporation, San Jose, CA (US)

(72) Inventors: Ruihua Li, Cupertino, CA (US); Yafu Lin, San Jose, CA (US)

(73) Assignee: MAXEON SOLAR PTE. LTD., Singapore (SG)

( * ) Notice: Subject to any disclaimer, the term of this patent is extended or adjusted under 35 U.S.C. 154(b) by 0 days.

(21) Appl. No.: 17/745,259

(22) Filed: May 16, 2022

(65) Prior Publication Data
US 2023/0369522 A1 Nov. 16, 2023

(51) Int. Cl.
*H01L 31/049* (2014.01)
*H01L 31/048* (2014.01)

(52) U.S. Cl.
CPC ........ *H01L 31/049* (2014.12); *H01L 31/0481* (2013.01)

(58) Field of Classification Search
CPC .. H01L 31/048; H01L 31/0481; H01L 31/049
See application file for complete search history.

(56) References Cited

U.S. PATENT DOCUMENTS

| | | | | |
|---|---|---|---|---|
| 2012/0048348 A1* | 3/2012 | Aritoshi | ................. | C08J 7/123 136/251 |
| 2013/0133726 A1* | 5/2013 | Graichen | ................ | B32B 27/36 156/324 |
| 2013/0180588 A1 | 7/2013 | Hufen et al. | | |
| 2013/0209795 A1 | 8/2013 | Liu | | |
| 2014/0000674 A1 | 1/2014 | Zhao | | |

FOREIGN PATENT DOCUMENTS

| | | | | |
|---|---|---|---|---|
| CN | 102400398 A | * | 4/2012 | |
| CN | 102529016 A | * | 7/2012 | |
| CN | 102400398 B | * | 3/2015 | |
| TW | 201310675 A | * | 3/2013 | ............ H01L 31/049 |
| WO | WO-2010019829 A1 | * | 2/2010 | ....... B32B 17/10045 |
| WO | WO-2012073804 A1 | * | 6/2012 | ............. B32B 27/06 |

OTHER PUBLICATIONS

Machine translation of WO-2012073804-A1, Amasaki Ichiro. (Year: 2012).*
Machine translation of TW-201310675-A, Akira H. (Year: 2013).*

(Continued)

*Primary Examiner* — Mayla Gonzalez Ramos
(74) *Attorney, Agent, or Firm* — GRASSO PLLC

(57) ABSTRACT

Photovoltaic (PV) laminates employ single polymer composites (SPCs). The SPCs may be located at various locations of the PV laminate. These locations may include being positioned as an entire back-sheet of the PV laminate as well as, as a portion of a back-sheet or other layer of the PV laminate. The SPCs may be positioned and configured in the PV laminate so as to reduce tensile and compressive forces developed on PV cells from live normal loads or other live loads or dead loads experienced by the PV laminate. The SPCs can serve to reduce the weight of a PV laminate as well as to assist in having PV cells lie along the neutral axis of the PV laminate.

20 Claims, 6 Drawing Sheets

(56) References Cited

OTHER PUBLICATIONS

Machine translation of CN-102529016-A, Wang, Jian, et al. (Year: 2012).*
Machine translation of CN-102400398-A, Zhang G. (Year: 2012).*
P.J. Hine et al., Hot Compaction of Polyethylene Naphthalate, Journal of Applied Polymer Science, vol. 93, 2004, pp. 796-802.
P.J. Hine et al., Hot Compaction of Woven Nylon 6,6 Multifilaments, Journal of Applied Polymer Science, vol. 101, 2006, pp. 991-997.
I.M. Ward et al., Novel Composites by Hot Compaction of Fibers, Polymer Engineering and Science, vol. 37, No. 11, Nov. 1997, pp. 1809-1814.
Albert Teishev et al., Polyethylene Fibers-Polyethylene Matrix Composites: Preparation and Physical Properties, Journal of Applied Polymer Science, vol. 50, 1993, pp. 503-512.
Nektaria-Marianthi Barkoula et al., Processing of Single Polymer Composites Using the Concept of Constrained Fibers, Polymer Composites, vol. 26, issue1, Feb. 2005, pp. 114-120.
N. Cabrera et al., Processing of all-polypropylene composites for ultimate recyclability, Proceedings of the Institution of Mechanical Engineers—Part L—Journal of Materials: Design and Applications, vol. 218, Apr. 1, 2004, pp. 145-155.
M. Mosleh et al., Manufacture and properties of a polyethylene homocomposite, Composites Part A: Applied Science and Manufacturing, vol. 29, Issues 5-6, 1998, pp. 611-617.
K.P. Matabola et al., Single polymer composites: a review, Journal of Materials Science, vol. 44, Dec. 1, 2009, pp. 6213-6222.
Donggang Yo et al., Single-Polymer Composites Based on Slowly Crystallizing Polymers, Polymer Engineering and Science, 2006, pp. 1223-1230.
Benjamin Alcock, Single Polymer Composites Based on Polypropylene: Processing and Properties, Materials Department, Queen Mary, University of London, Mar. 2004, pp. 1-291.
F.v. Lacroix et al., Solution impregnation of polyethylene fibre/polyethylene matrix composites, Composites Part A: Applied Science and Manufacturing, vol. 29, issue 4, 1998, pp. 371-376.

* cited by examiner ts patent

PHOTOVOLTAIC LAMINATE COMPRISING SINGLE POLYMER COMPOSITE

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

PV laminates comprise layers of material such as PV cells surrounded by encapsulant and positioned between top and bottom layers of sheets surrounding the PV cells and encapsulant. The top and bottom layers of sheets can be made from glass, polymer sheets, composites and so on. The top sheet is preferably clear to allow a maximum amount of sunlight to reach the active face of the PV cells. The encapsulant surrounding the PV cells along with the top and bottom layers of sheets provide some amount of environmental protection to the PV cells. The PV laminates, supported at their edges by a support frame of some kind, experience a dead load associated with the weight of the constituent parts of the PV laminate as well as live loads derived from various environmental factors such as wind, snow, and impact projectiles (e.g., hail, plant limbs, and wind-swept debris).

DETAILED DESCRIPTION

Figure 1:
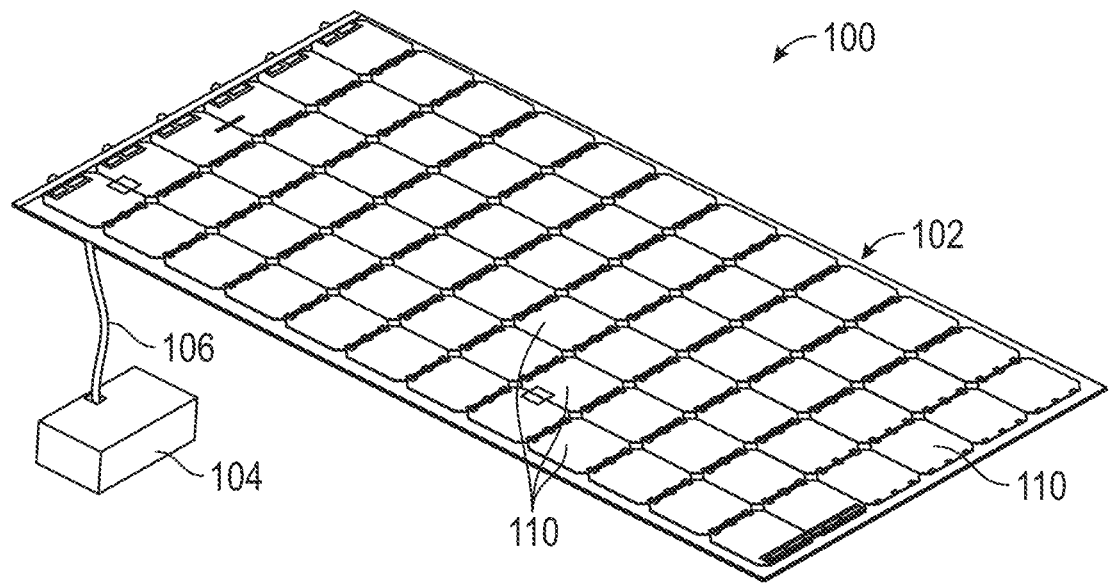
FIG. 1 illustrates a perspective view of a two-dimensional array of PV cells as may be employed in some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112(f) for that unit/component.

"First," "Second," etc. As used herein, these terms are used as labels for nouns that they precede, and do not imply any type of ordering (e.g., spatial, temporal, logical, etc.). For example, reference to a "first" single polymer composite (SPC) back-sheet does not necessarily imply that this SPC back-sheet is the first back-sheet in a sequence; instead, the term "first" is used to differentiate this SPC back-sheet from another SPC back-sheet (e.g., a "second" SPC back-sheet).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

SPC systems may be understood to employ combinations of a single polymer composites in multiple configurations where each configuration has different material properties. These different material properties may be created through processing techniques tailored to create a first configuration of a material having a first set of mechanical properties and then a second configuration of the same material having a second set of mechanical properties. There may be overlap in the mechanical properties between the first phase and the second phase but some mechanical property differences should exist. An example of an SPC may include a first configuration of polypropylene as a woven fabric and a second configuration of polypropylene as a unidirectional film where the film and the fabric are combined with one another in such a manner so that they interact with each other and cumulatively act when active loads are applied. SPCs may be considered environmentally friendly composites as they may be easy to recycle. For example, when heated above its melting temperature, both of the reinforcement of an SPC and the resin of an SPC melt together and become the same polymer.

Various exemplary PV laminates employing one or more partial or full layers of single polymer composites are provided. By employing such SPCs in PV laminates, embodiments may improve the live load performance of a PV laminate under one or more of front live loading and back live loading. In embodiments, an SPC layer may provide for a stiff back-sheet or other stiff layer of a PV laminate. The stiff back-sheet or other stiff layer can help to reduce stress on PV cells of the PV laminate and in so doing serve to reduce cell cracking or other PV cell damage under mechanical live loading. In embodiments, an external facing back-sheet or other layer may comprise single polymer composites (SPCs). For example, a rigid back-sheet with SPCs can help to reduce live loading and other stress on the PV cell under snow loading or other live loaving scenarios.

As noted above, SPCs are considered to be a composite even though both the reinforcement and the supporting matrix are made from the same polymer. As shown in tables and text below, SPCs can be preferred over thin single material polymer back-sheets in a PV laminate as the composite nature of the SPCs can provide for improved mechanical properties when compared to thin single material polymer back-sheets. As also shown in tables and text below, employing SPCs instead of glass or heterogenous composites may result in comparatively lighter weight PV laminates. In embodiments, for example a back-sheet layer may be made from a single polymer composite wherein both the reinforcement and the resin are made from the same polymer, such as polyethylene terephthalate (PET) single polymer composites. Other polymers that may be employed may comprise thermoplastics such as PET, PP, PLA, UHMWPE, and PMMA. In each instance both the reinforcement and the matrix(binder) for the SPCs of that polymer are made from same polymer.

SPCs of embodiments may be positioned at various layers and various portions of the PV laminate and may provide resistance to dead loads as well as resistance to static mechanical loading (SML) or other live loads. This resistance may increase the structural performance of the PV laminate as well as the durability of the PV laminate. For example, PV cells of a PV laminate in embodiments with an SPC layer may experience lower stress levels under live loading than PV cells located in identical PV laminates lacking an SPC layer. The use of SPC layers may also serve to reduce the weight of a PV laminate when compared to a PV laminate showing substantially similar structural performance. In other words, a first PV laminate, with SPC layer(s), can weigh less than a second PV laminate with conventional upper and lower glass layers but exhibit substantially similar, identical, or improved structural performance under live loading.

SPCs of embodiments may be manufactured using various techniques. These techniques may comprise one or more of: hot compaction of fibers; hot compaction of two components; solution impregnation of two components; constrained fiber processing; copolymer approach; variation of molecular weight; variation of chain configuration; and others. Also, different physical states and material forms of raw polymers may be used in SPCs manufacturing, including melts, solutions, powders, films, tapes, unidirectional lay-ups, chopped fiber, and/or fabrics.

When SPCs are employed in embodiments, similarly sized layers in a PV laminate may have a lower density and a lighter weight when compared to similarly sized glass multi-material composite layers. Also, SPCs may have better mechanical properties than a polymer film of the same material and in so doing can serve to provide improved mechanical load performance for a PV laminate and improved strength and durability of a back-sheet of the PV laminate. The interfacial adhesion between the reinforcement and the supporting matrix of an SPC may be more durable, stronger, or otherwise preferred when compared to traditional heterogenous composites. And, there can be little to no coefficient of thermal expansion (CTE) mismatch between reinforcement and the supporting matrix of single polymer composites in embodiments. For example, compared with traditional heterogeneous composites (FR4) and common PV laminate back-sheet materials (e.g., PET, PP and ultra-high molecular weight polyethylene (UHMWPE)), homogeneous SPCs can have much lower density and weight.

In embodiments, SPCs may be used to replace a PET back-sheet in a monofacial solar cell modules (glass-PET back-sheet) to improve the snow loading performance. SPCs may also be used to replace the FR4 (hetero composites) in flexible solar modules (e.g., front sheet is clear polymer sheet, back-sheet is FR4). SPCs can be lighter than FR4 but can have similar mechanical performance.

In embodiments, an SPCs layer may be thinner than a layer of glass of a PV laminate. Also, the SPC may weigh less than the glass layer and also provide better protection from cracking under loading for PV cells of the PV laminate. PV cells of embodiments may be positioned along a neutral axis of the PV laminate. A neutral axis may be considered to be a reference plane in the PV laminate where internal tensile and compressive forces reach near zero or zero when considering normal loading of the PV laminate. SPCs employed in embodiments may have various densities including 1.2-1.5 g/cm³. Because the density of SPCs in embodiments can be less than glass, the weight of a layer of SPC in a PV laminate may be less than a glass layer.

While full layers of SPCs may be employed in embodiments, i.e., the layer of SPC extends underneath an entire PV cell array of the PV laminate, some layers of SPCs in embodiments may not be so sized. In other words, in embodiments, some layers of SPCs may only extend below a portion of a PV cell array. In so doing, different deflection/stiffness properties may be created for a PV laminate in different sections of the PV laminate. In sections of the PV laminate with an SPC the stiffness of the PV laminate would be greater than sections of the PV laminate without an SPC. These areas of greater stiffness may be employed on sections of the PV laminate where forces under live loading or dead loading may be greater than other portions of a PV laminate where live loading and dead loading may be less. For example, in a perimeter supported PV laminate the center section of the PV laminate may have SPC back-sheet support while edges of the edge supported PV laminate may have less or no SPC back-sheet. Similarly, an SPC back-sheet may have a varying thickness or a uniform thickness along its layer. The thickness of the SPCs may be set depending upon the support system of the PV laminate with areas of higher anticipated stresses receiving thicker SPC material and areas of lower anticipated stresses receiving less thick SPC material. In so doing, weight of the PV laminate may be further reduced while seeking to maintain a minimum amount of protection for PV cells of the PV laminate. The SPC thickness can range from 0.2 mm or so to 10 mm thick or so, preferably 0.5 mm-4.0 mm. Other values may also be possible.

Some embodiments may include glass layer or layers above a PV cell array and an SPC bottom layer or layers below the PV cell array. Some embodiments may include glass layers above and below the PV cell array while also having SPCs above and below the PV array layer. Other combinations of SPCs and glass may also be employed in embodiments.

Photovoltaic laminates of embodiments may comprise an array of photovoltaic cells where the photovoltaic cells each have a sun receiving face, a bottom face, and may be electrically connected to one or more photovoltaic cells of the array. The PV laminate may also comprise an encapsulant in contact with at least the sun receiving face or the bottom face of a photovoltaic cell of the array; a transparent layer positioned above the array; and a single polymer composite positioned below the array, the single polymer composite comprising a binder of a first polymer and a reinforcement of the first polymer.

In some PV laminate embodiments, the single polymer composite may consist essentially of the matrix of a first polymer and the reinforcement of a polymer. In some PV laminate embodiments, an array of photovoltaic cells may comprise a perimeter, wherein encapsulant surrounds the array of photovoltaic cells, and wherein the single polymer composite may be planar and may extends to the perimeter of array of photovoltaic cells. In some PV laminate embodiments, an array of photovoltaic cells may comprise a perimeter and a perimeter edge, wherein an encapsulant surrounds each photovoltaic cells of the array of photovoltaic cells, and wherein a single polymer composite is planar and extends beyond the perimeter edge of the array of photovoltaic cells.

Still further in some PV laminate embodiments, glass may comprise a transparent layer and the photovoltaic laminate may have a neutral axis under a top distributed live load, where an array of photovoltaic cells may be positioned along the neutral axis. In some embodiments, the array of photovoltaic cells may be two-dimensional array and the single polymer composite may comprise polyethylene terephthalate (PET). And, in some PV laminate embodiments, a tensile modulus of a single polymer composite being employed may be in the range of 5-300 MPa and may have a tensile strength in the range of 90 MPa-3 GPa.

Photovoltaic laminates of embodiments may comprise a layer of glass; a first layer of encapsulant positioned below the layer of glass; a photovoltaic cell layer positioned below the first layer of encapsulant; a second layer of encapsulant positioned below the photovoltaic cell layer; and a layer of single polymer composite, the single polymer composite comprising a binder of a first polymer and a reinforcement of the first polymer, the layer of polymer composite positioned below the layer of glass. In some PV laminate embodiments, a first layer of encapsulant and a second layer of encapsulant may be connected to each other with encapsulant material, such as the resin of the encapsulant. In some PV laminate embodiments, a photovoltaic cell layer may comprise an array of separate photovoltaic cells and a first layer of encapsulant and a second layer of encapsulant may be connected to each other with encapsulant and may completely surround each separate photovoltaic cell of the array of photovoltaic cells. In some PV laminate embodiments, a back-sheet layer, such as PET, and not comprising a single polymer composite, may be employed and may be in contact with or spaced apart from a layer of single polymer composite. In some PV laminate embodiments, a back-sheet layer is an outermost layer of the photovoltaic laminate and comprises polyethylene terephthalate (PET) whereas in other embodiments a back-sheet layer comprises a polymer and is not an outermost layer of the photovoltaic laminate. In some PV laminates, the photovoltaic cell layer may be planar and may be positioned at the neutral axis of the PV laminate.

Some PV laminate embodiments may comprise a plurality of photovoltaic cells having a perimeter; an encapsulant surrounding the plurality of photovoltaic cells and extending beyond the perimeter; a planar transparent layer positioned above the encapsulant and extending beyond the perimeter; and a planar layer of single polymer composite, the single polymer composite comprising a binder of a first polymer and a reinforcement of the first polymer, the layer of polymer composite positioned below the encapsulant. In some PV laminate embodiments, a planar layer of single polymer composite may extend beyond the perimeter of a plurality of PV cells. In some embodiments, a planar back-sheet layer in contact with a planar layer of single polymer composite may be present. In some embodiments, a first polymer for use as an SPCs may be selected from a group consisting of polyethylene terephthalate (PET), polypropylene (PP), and ultra-high-molecular-weight polyethylene (UHMWPE). In some embodiments, an SPCs may comprise UHMWPE or PP.

Figure 2:
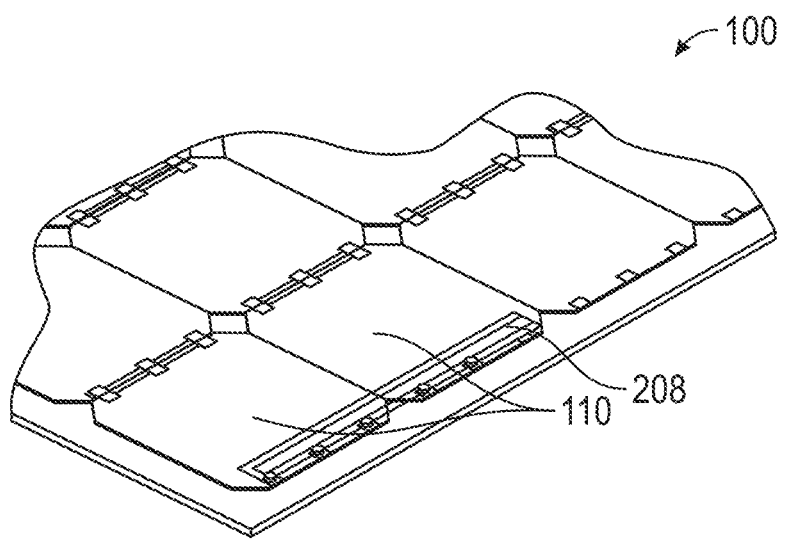
FIG. 2 illustrates an enlarged portion of a corner of the two-dimensional array of PV cells as may be employed in some embodiments.

FIG. 1 illustrates a perspective view of a two-dimensional array of PV cells mounted on a back-sheet as may be employed in some embodiments. Labelled in FIG. 1 are the PV array 100, the back-sheet perimeter edge 102 of the PV array 100, PV cells 110, a module level power electronic module 104 and a connecting wire 106. FIG. 2 illustrates an enlarged portion of a corner of the two-dimensional array of PV cells as may be employed in some embodiments.

Labelled in FIG. 2 are the PV connecting wires 208 along with the PV array 100 and the PV cells 110 and the perimeter edge 102 of the back-sheet 103.

The PV array 100 is shown as a two-dimensional array, i.e., having multiple lines of strings. Single string PV arrays, i.e., one line of strings and other configurations of PV arrays may also be employed in embodiments. The PV array 100 may be positioned as a layer of a multilayer PV laminate in embodiments. These multiple layers may be configured and positioned to cushion and protect the PV array from environmental impacts. These can include live loading on the face of the PV laminate as well as corrosion and other deleterious effects of the environment. Embodiments, may be configured to reduce the number and strength of mechanical stresses placed on the PV arrays and their individual cells and connecting wires in order to prolong the life and/or effectiveness of the PV array over its lifespan. In embodiments, by placing layers above and below the PV array mechanical stresses can be reduced or eliminated on the PV cells and the other components of the PV array. Through the use of SPCs as full or partial layer(s) support of the PV array may be provided. SPC layers (whether full or partial) may also provide for weight loss when compared to heavier materials, such as glass layers. When installed, PV arrays may be mounted on the same reference plane as well as in a tiered or shingled pattern with overlapping edges such as asphalt single or cedar shingle roof installations. Other installation configurations of the PV arrays may also be possible.

Figure 3:
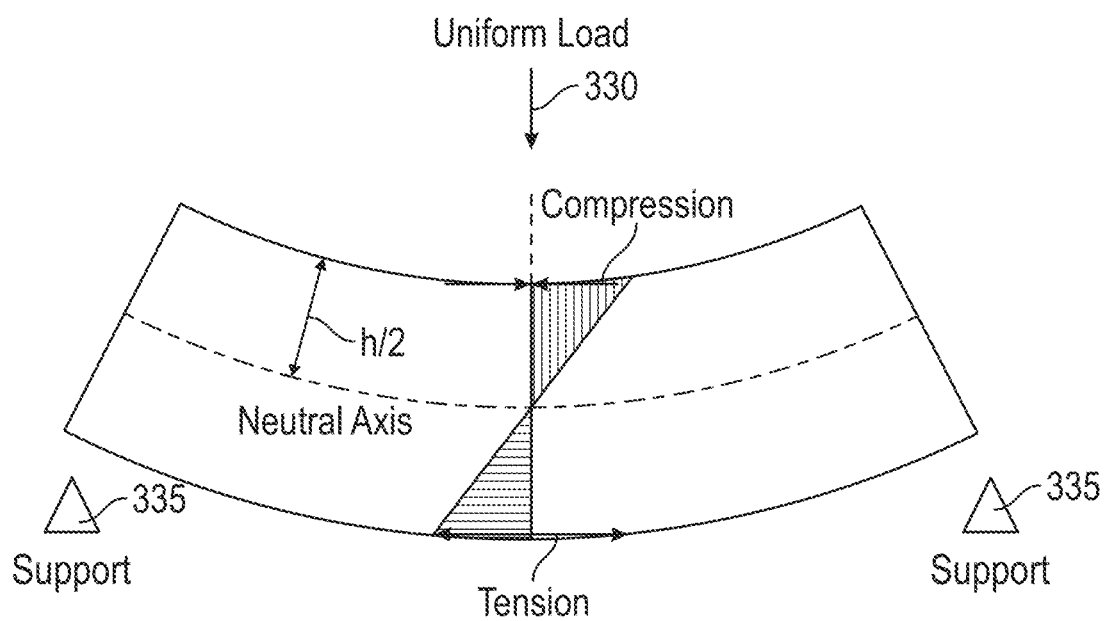
FIG. 3 illustrates a side sectional view of compressive and tensile forces as may be experienced by a PV laminate under passive or live loading conditions in some embodiments.

FIG. 3 illustrates a side sectional view of compressive and tensile forces as may be experienced by a PV laminate under passive or live loading conditions in some embodiments. A PV array in embodiments may be positioned along the neutral axis with one or more layers above and below the PV array so as to locate the PV array at that neutral axis. As can be seen in FIG. 3, compressive and tensile forces are larger near the surfaces and are near zero or reach zero at the neutral axis. Uniform loading 330 and supports 335 are labelled in FIG. 3 for understanding how the deflection and developed stresses can be formed.

Figure 4:
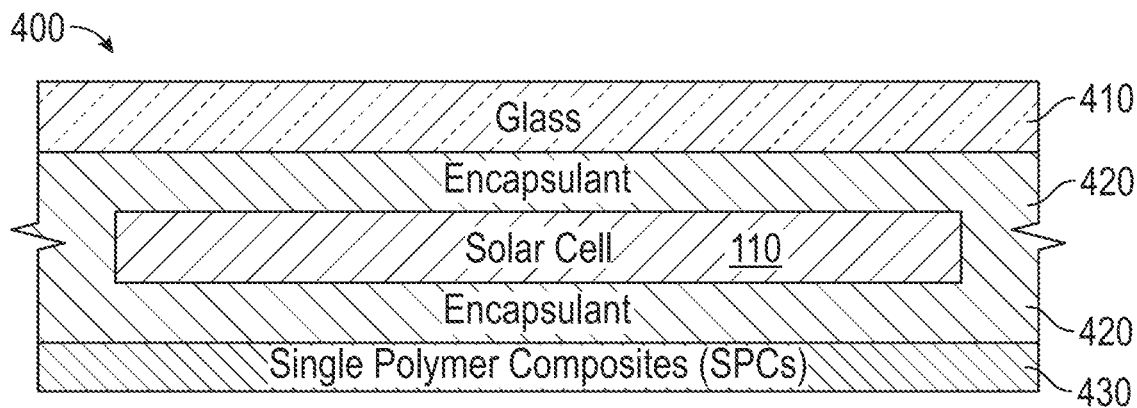
FIG. 4 illustrates a side sectional view of a PV laminate as may be employed in some embodiments.

FIG. 4 illustrates a side sectional view of a PV laminate 400 as may be employed in some embodiments. Labelled in FIG. 4 are the glass layer 410, encapsulant 420, PV array 100, and single polymer composite. As can be seen, the encapsulant surrounds the PV array 100 and there is a glass top sheet and an SPCs back-sheet. Each of the protective layers of the PV laminate in FIG. 4 extend to the perimeter edges of the PV laminate 400. In some embodiments, one or more layers may not be such a full layer and may, instead only occupy a portion of the layer of the PV laminate 400. For example, the encapsulant may not reach the perimeter of the PV laminate and may instead only extend past the PV arrays with SPCs or another material filling up the remainder of the space for that layer. As can be seen in FIG. 4, the layer of SPC is thicker than the layer of glass 410. This thicker layer of SPC 430 may be employed in embodiments to account for the physical properties of SPCs when compared to the glass 410. However, even given this thicker layer, an SPC employed in embodiments may have a lower density than glass, and may therefore weigh less even though the SPCs may be thicker than the glass layer. In embodiments, an SPC layer may be thinner than a glass layer and may be thicker than a PET back-sheet. SPC thickness can be 0.5 mm-4 mm. The preferred thickness can be 0.5 mm-2 mm. The thinner the thickness, the lower the cost.

Figure 5:
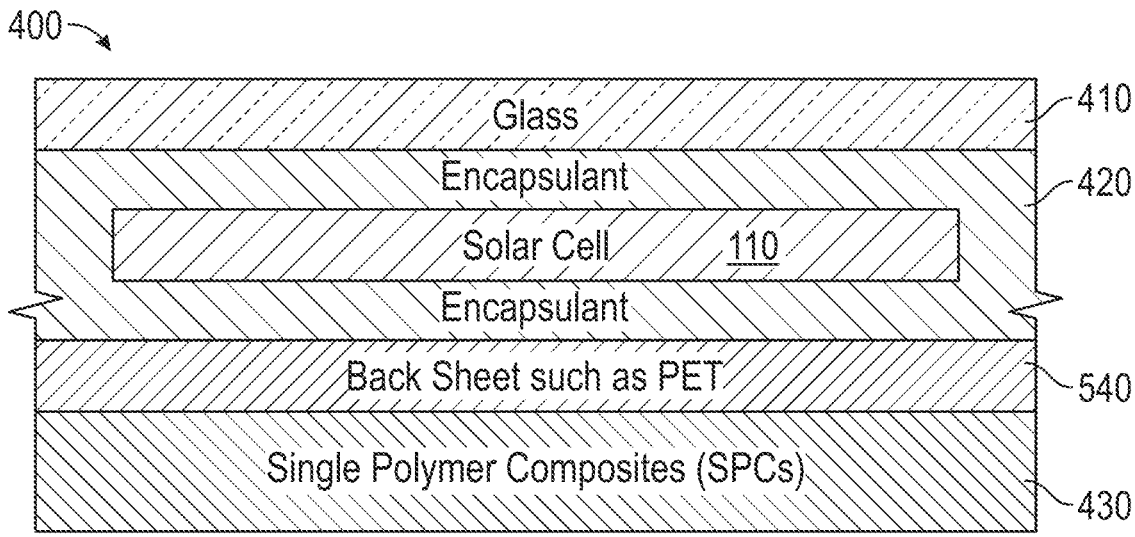
FIG. 5 illustrates a side sectional view of a PV laminate as may be employed in some embodiments.
Figure 6:
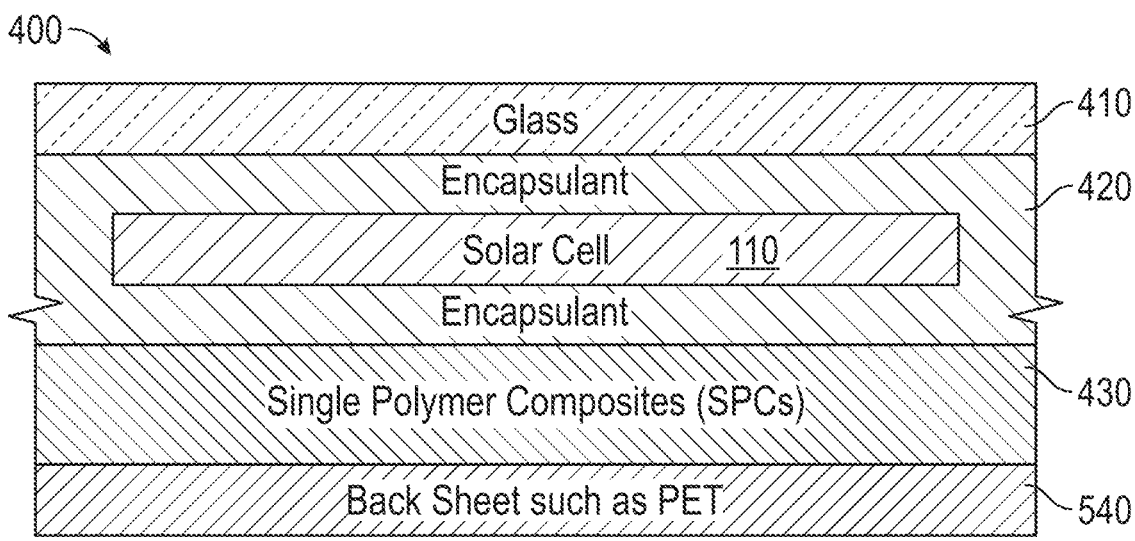
FIG. 6 illustrates a side sectional view of a PV laminate as may be employed in some embodiments.

FIG. 5 illustrates a side sectional view of a PV laminate as may be employed in some embodiments. Labelled in FIG. 5 are the glass 410, encapsulant 420, PV array 100, a PET back-sheet 540, and an SPCs back-sheet 430. FIG. 6 illustrates a side sectional view of a PV laminate as may be employed in some embodiments. Labelled in FIG. 6 are the glass 410, encapsulant 420, PV array 100, a PET back-sheet 540, and an SPC back-sheet 430. As can be seen in both FIG. 5 and FIG. 6 additional materials beyond an SPC may be employed behind the PV array 100 and the SPC may or may not be the outermost back-sheet being employed. In FIG. 5, for example, the PET back-sheet is above the SPC while in FIG. 6, for example, the PET back-sheet 540 is the outermost layer of the PV laminate 400.

Figure 7:
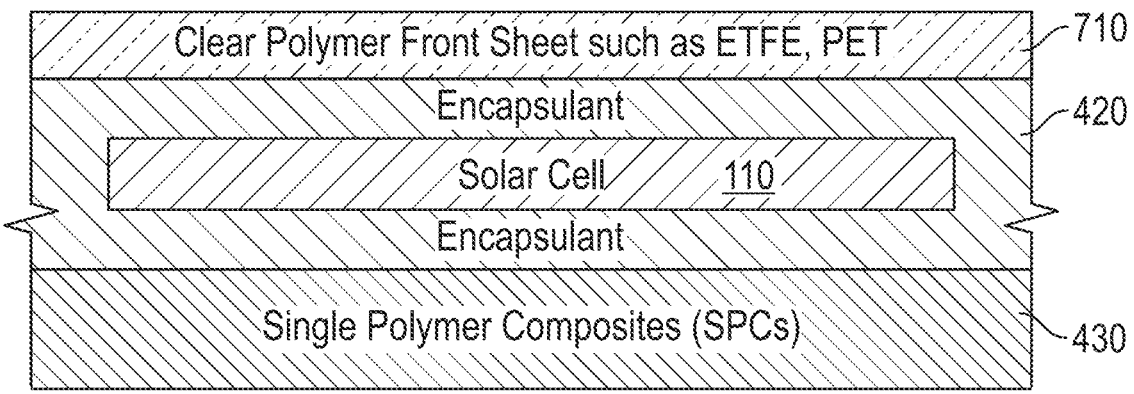
FIG. 7 illustrates a side sectional view of a PV laminate as may be employed in some embodiments.

FIG. 7 illustrates a side sectional view of a PV laminate as may be employed in some embodiments. Labelled in FIG. 7 are a clear polymer front sheet 710, which may be comprised of ETFE, PET, etc., encapsulant 420, a solar cell 110, and a single polymer composite back-sheet 430. Thus, FIG. 7 demonstrates that various materials and material orders may be employed in embodiments.

Figure 8:
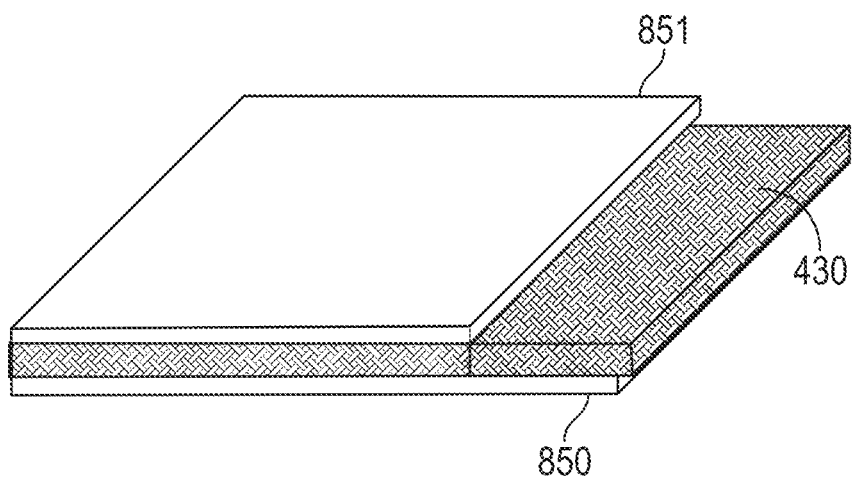
FIG. 8 illustrates a perspective view of a single polymer composite in a multilayer laminate as may be employed in some embodiments.
Figure 9:
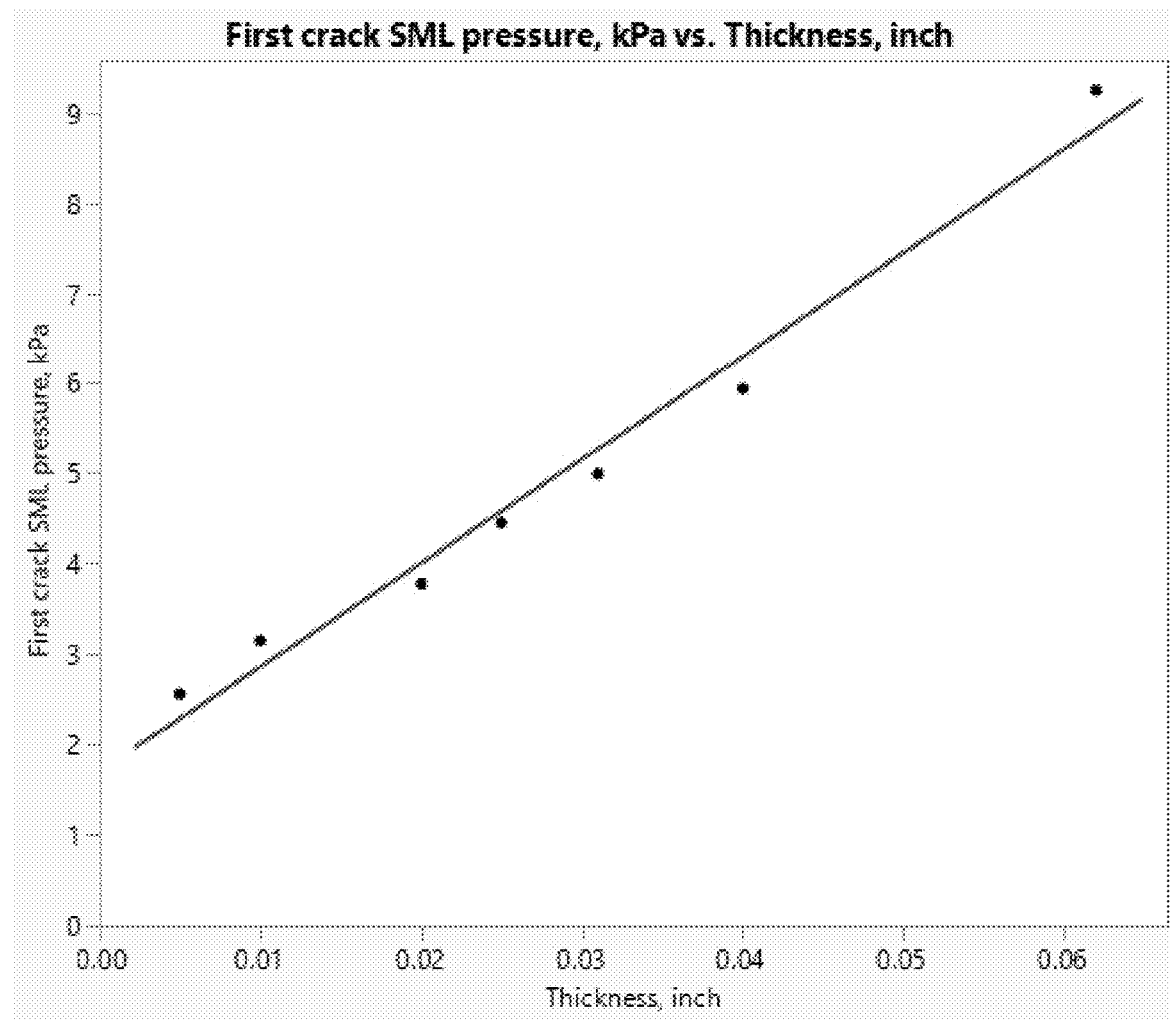
FIG. 9 illustrates a graph with First Crack SML Pressure plotted versus Thickness in inches.
Figure 10:
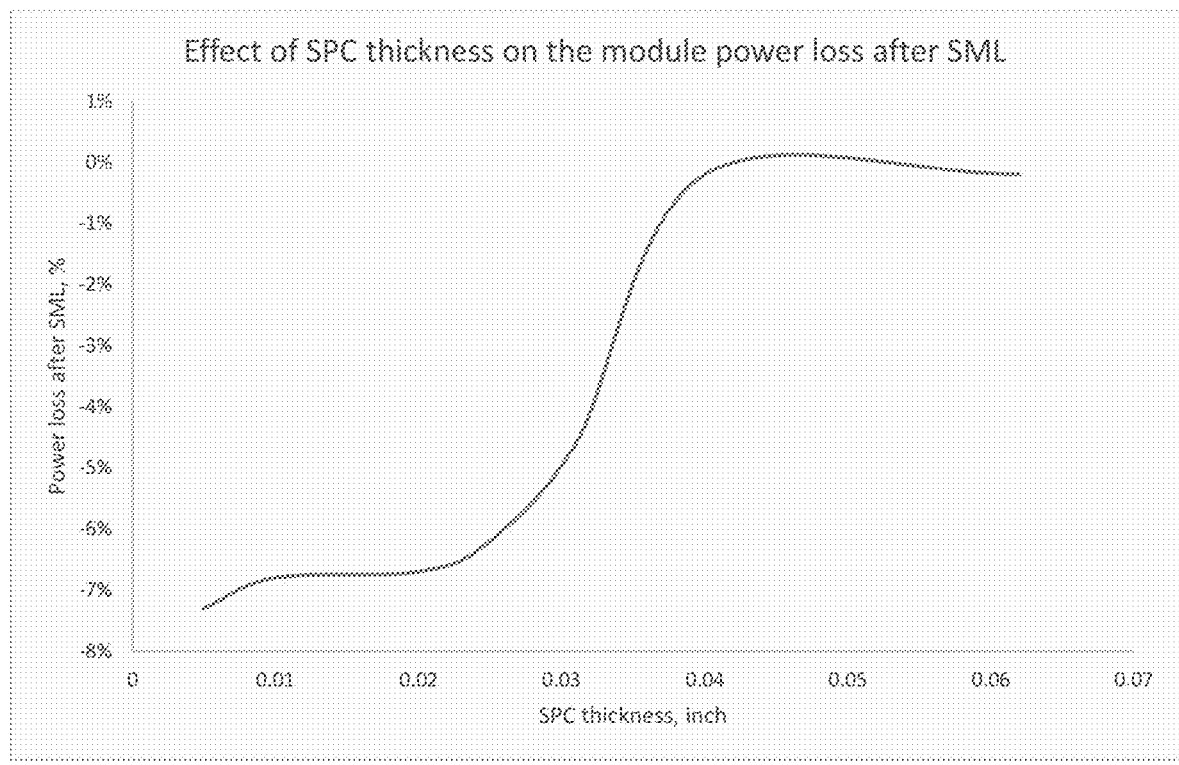
FIG. 10 illustrates a graph with Power Loss After SML plotted versus SPC Thickness in inches.

FIG. 8 illustrates a perspective view of a single polymer composite 430 in a multilayer laminate as may be employed in some embodiments. The multilayer laminate of FIG. 8 has first layer 850 and second layer 851. These layers may themselves be SPCs as well as different materials. The multilayer laminate may be employed with non or additional layers in support of a PV array in embodiments. The layers may have the same perimeter dimensions or may have different perimeter dimensions as shown in FIG. 8 and as in embodiments. Moreover, in FIG. 8, as in embodiments, the layers may have the same, similar, and different thicknesses.

As noted above, various polymers may be employed as an SPC. In some embodiment, the tensile strength of the selected fiber may be less than a factor of one to that of glass fiber and carbon fiber while in other instances the tensile strength of the selected SPC fibers may be up to nine times less than the tensile strength of carbon fiber. Nevertheless, adhesion properties, weight of glass, weight of carbon, manufacturing flexibility, design flexibility, cost, and other factors can provide advantages of using SPCs over glass and carbon reinforced layers. Table A provides exemplary ranges for tensile strength, density, and tensile modulus for various SPC materials as well as for non-SPC materials (i.e., glass fiber and carbon fiber).

TABLE A

Types and mechanical properties of polymer fiber, which may be employed as SPCs, as well as other non-SPC reinforcement fibers.

| Fibers | Density g/cm³ | Tensile Strength, MPa | Tensile Modulus, GPa |
|---|---|---|---|
| UHMWPE Fiber | 0.96 | 2800 | 172 |
| PE Fiber | 0.96 | 1000-1500 | 40-70 |
| PP Fiber | 0.9 | 650 | 5-20 |
| PET Fiber | 1.38 | 400-470 | 2.2-2.9 |
| Vectran ® M | 1.396 | | 83.7 |
| Vectran ® HS | 1.403 | | 88.8 |
| Glass Fiber | 2.54 | 3000 | 75 |
| Carbon Fiber | 1.8 | 3600 | 250 |

Table B provides a comparison of four SPC back-sheet layer materials with two non-SPC back-sheet materials. As can be seen in Table B, the tensile strength of each SPC is larger than the tensile strength of the two non-SPCs (i.e., FR4 and PET sheet). As can also be seen, SPCs are generally less dense, although not in every instance.

TABLE B

SPC and Non-SPC Material Properties

| | Density, g/cm³ | Tensile Strength, MPa | Tensile Modulus, GPa |
|---|---|---|---|
| 25% fill PET/PET SPCS | 1.38 | 94 | N/A |
| PP/PP SPCs | 0.732 | 450 | 15 |
| UHMWPE fibers/HDPE SPCs | 0.96 | 600 | 20 |
| UHMWPE SPCS | 0.96 | 1300-1500 (longitude) | N/A |
| FR4 (glass fiber/epoxy composites) | 1.85 | 262 | 24 |
| PET Sheet | 1.38 | 55 | 2.7 |

In some embodiments the tensile modulus of an SPC layer may be in the range of a 5-300 MPa improvement from thin PET non SPC layers and the tensile strength may be in the range of a 90 MPa-3 GPa improvement from thin PET non-SPC layers.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure. The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A photovoltaic laminate comprising:
   an array of photovoltaic cells, the photovoltaic cells each having a sun receiving face and a bottom face, wherein each photovoltaic cell of the array of photovoltaic cells is electrically connected to one or more other photovoltaic cells of the array;
   an encapsulant in contact with at least the sun receiving face or the bottom face of at least one photovoltaic cell of the array of photovoltaic cells;
   a transparent layer positioned above the sun receiving face of photovoltaic cells of the array of photovoltaic cells; and
   a single polymer composite positioned below the array of photovoltaic cells, the single polymer composite comprising a matrix and a reinforcement of the matrix, the matrix comprising a first polymer, having a first set of mechanical properties and the reinforcement of the matrix consisting of the first polymer and having a second set of mechanical properties, the first set of mechanical properties different from the second set of mechanical properties.

2. The photovoltaic laminate of claim 1 wherein the single polymer composite consists essentially of the matrix of the first polymer and the reinforcement consisting of the first polymer and wherein the encapsulant is in contact with the sun receiving face or the bottom face, or both, of the array of photovoltaic cells.

3. The photovoltaic laminate of claim 1 wherein the array of photovoltaic cells further comprises a perimeter, wherein the encapsulant surrounds the array of photovoltaic cells, and wherein the single polymer composite is planar and extends to the perimeter of the array of photovoltaic cells.

4. The photovoltaic laminate of claim 1 wherein the array of photovoltaic cells further comprises a perimeter and a perimeter edge, wherein the encapsulant surrounds each photovoltaic cells of the array of photovoltaic cells, and wherein the single polymer composite is planar and extends beyond the perimeter edge of array of photovoltaic cells.

5. The photovoltaic laminate of claim 1 wherein the transparent layer is one or more of glass or a transparent polymer sheet and wherein the photovoltaic laminate has a neutral axis under a top distributed live load, the array of photovoltaic cells positioned along the neutral axis.

6. The photovoltaic laminate of claim 1 wherein the single polymer composite comprises polyethylene terephthalate (PET).

7. The photovoltaic laminate of claim 1 wherein the tensile modulus of the single polymer composite is in the range of 5-300 MPa and has a tensile strength in the range of 90 MPa-3 GPa.

8. A photovoltaic laminate comprising:
   a transparent front sheet layer;
   a first layer of encapsulant positioned below the transparent front sheet;
   a photovoltaic cell layer positioned below the first layer of encapsulant;
   a second layer of encapsulant positioned below the photovoltaic cell layer; and
   a layer of single polymer composite, the single polymer composite comprising a matrix of a first polymer having a first set of mechanical properties and a reinforcement combined with the matrix, the reinforcement consisting of the first polymer, the reinforcement having a second set of mechanical properties, the first set of mechanical properties different from the second set of mechanical properties, the layer of single polymer composite positioned below the transparent front sheet layer.

9. The photovoltaic laminate of claim 8 wherein the first layer of encapsulant and the second layer of encapsulant are connected to each other with encapsulant material and wherein the transparent front sheet layer comprises glass.

10. The photovoltaic laminate of claim 9 wherein the photovoltaic cell layer comprises an array of separate photovoltaic cells and wherein the first layer of encapsulant and the second layer of encapsulant are connected to each other with encapsulant material and completely surround each separate photovoltaic cell of the array of photovoltaic cells.

11. The photovoltaic laminate of claim 8 further comprising a back-sheet layer, the back-sheet layer not comprising a single polymer composite, the back-sheet layer in contact with the layer of single polymer composite.

12. The photovoltaic laminate of claim 11 wherein the back-sheet layer is an outermost layer of the photovoltaic laminate and comprises polyethylene terephthalate (PET).

13. The photovoltaic laminate of claim 11 wherein the back-sheet layer comprises a polymer and is not an outermost layer of the photovoltaic laminate.

14. The photovoltaic laminate of claim 8 wherein the photovoltaic laminate has a neutral axis and the photovoltaic cell layer is planar and is positioned at the neutral axis.

15. A photovoltaic laminate comprising:
- a plurality of photovoltaic cells having a perimeter;
- an encapsulant surrounding the plurality of photovoltaic cells and extending beyond the perimeter;
- a planar transparent layer positioned above the encapsulant and extending beyond the perimeter; and
- a planar layer of single polymer composite, the single polymer composite comprising a matrix of a first polymer having a first set of mechanical properties and a reinforcement consisting of the first polymer, the reinforcement combined with the matrix of the first polymer, the reinforcement consisting of the first polymer and having a second set of mechanical properties, the first set of mechanical properties different from the second set of mechanical properties, the layer of single polymer composite positioned below the encapsulant.

16. The photovoltaic laminate of claim 15 wherein the planar layer of single polymer composite extends beyond the perimeter.

17. The photovoltaic laminate of claim 15 further comprising a planar back-sheet layer in contact with the planar layer of single polymer composite.

18. The photovoltaic laminate of claim 15 wherein the first polymer is selected from a group consisting of polyethylene terephthalate (PET), polypropylene (PP), and ultra-high-molecular-weight polyethylene (UHMWPE) or a thermal plastic material.

19. The photovoltaic laminate of claim 18 wherein the first polymer is UHMWPE.

20. The photovoltaic laminate of claim 18 wherein the first polymer is PP.

* * * * *